United States Patent
Sato

(10) Patent No.: US 11,060,180 B2
(45) Date of Patent: Jul. 13, 2021

(54) FERROMAGNETIC MATERIAL SPUTTERING TARGET

(71) Applicant: JX Nippon Mining & Metals Corporation, Tokyo (JP)

(72) Inventor: Atsushi Sato, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 696 days.

(21) Appl. No.: 15/752,061

(22) PCT Filed: Sep. 12, 2017

(86) PCT No.: PCT/JP2017/032932
§ 371 (c)(1),
(2) Date: Feb. 12, 2018

(87) PCT Pub. No.: WO2018/047978
PCT Pub. Date: Mar. 15, 2018

(65) Prior Publication Data
US 2020/0216945 A1 Jul. 9, 2020

(30) Foreign Application Priority Data

Sep. 12, 2016 (JP) .............................. JP2016-178008

(51) Int. Cl.
*C23C 14/34* (2006.01)
(52) U.S. Cl.
CPC .................. *C23C 14/3414* (2013.01)
(58) Field of Classification Search
CPC ........... C23C 14/3414; C23C 14/0688; C23C 14/35; C22C 1/04; C22C 32/0005;
(Continued)

(56) References Cited

U.S. PATENT DOCUMENTS 4,333,902 A * 6/1982 Hara ....................... B22F 3/125
264/320
5,398,639 A * 3/1995 Doll ........................ C30B 29/38
117/4
(Continued)

FOREIGN PATENT DOCUMENTS

EP 0429993 A2 * 6/1991 ............... G11B 5/10
JP 2003-313659 A 11/2003
(Continued)

OTHER PUBLICATIONS

Furlan, Kaline Pagnan, et al., Solid State Reaction Detected Between Hexagonal Boron Nitride and Iron During Sintering, 2016, Microsc. Microanal. 22 (Suppl 3), p. 1986-1987 (Year: 2016).*

(Continued)

*Primary Examiner* — James Lin
*Assistant Examiner* — Patrick S Ott
(74) *Attorney, Agent, or Firm* — Nields, Lemack & Frame, LLC

(57) ABSTRACT

There is provided a BN-containing ferromagnetic material sputtering target which is capable of suppressing generation of particles during sputtering. A sputtering target containing from 1 to 40 at. % of B and from 1 to 30 at. % of N and comprising a structure including at least one ferromagnetic metal-containing metal phase and at least one nonmagnetic material phase, wherein an X-ray diffraction profile obtained by analyzing the structure with an X-ray diffraction method exhibits a diffraction peak derived from cubic boron nitride.

28 Claims, 2 Drawing Sheets

(58) Field of Classification Search
CPC ... C22C 33/0278; C22C 33/0292; C22C 5/04; C22C 33/02; C22C 1/051; C22C 1/0466; G11B 5/653; G11B 5/65; G11B 5/851; H01F 41/183; H01F 1/33; H01F 10/123; C30B 29/38; B22F 2999/00
USPC .................................................. 204/298.13
See application file for complete search history.

(56) References Cited

U.S. PATENT DOCUMENTS

| | | | |
|---|---|---|---|
| 2002/0170821 | A1 | 11/2002 | Sandlin et al. |
| 2004/0025631 | A1* | 2/2004 | Fries ........................ B24D 3/06 75/238 |
| 2015/0213822 | A1* | 7/2015 | Ogino .................... C22C 33/02 75/233 |
| 2017/0294203 | A1 | 10/2017 | Ogino |

FOREIGN PATENT DOCUMENTS

| | | |
|---|---|---|
| JP | 2004-532931 A | 10/2004 |
| JP | 2016-84538 A | 5/2016 |
| WO | 2014/045744 A1 | 3/2014 |
| WO | 2014/065201 A1 | 5/2014 |
| WO | 2014/185266 A1 | 11/2014 |
| WO | 2016/047236 A1 | 3/2016 |
| WO | 2016/047578 A1 | 3/2016 |

OTHER PUBLICATIONS

Marichy, et al., "Fabrication of BN membranes containing high density of cylindrical pores using an elegant approach," 2017, RSC Adv., 7, 20709-20715 (Year: 2017).*
International Search Report dated Oct. 10, 2017 in corresponding PCT application No. PCT/JP2017/0329320.
International Preliminary Report on Patentability dated Mar. 21, 2019 in corresponding PCT application No. PCT/JP2017/032932.

* cited by examiner

[FIG. 1]
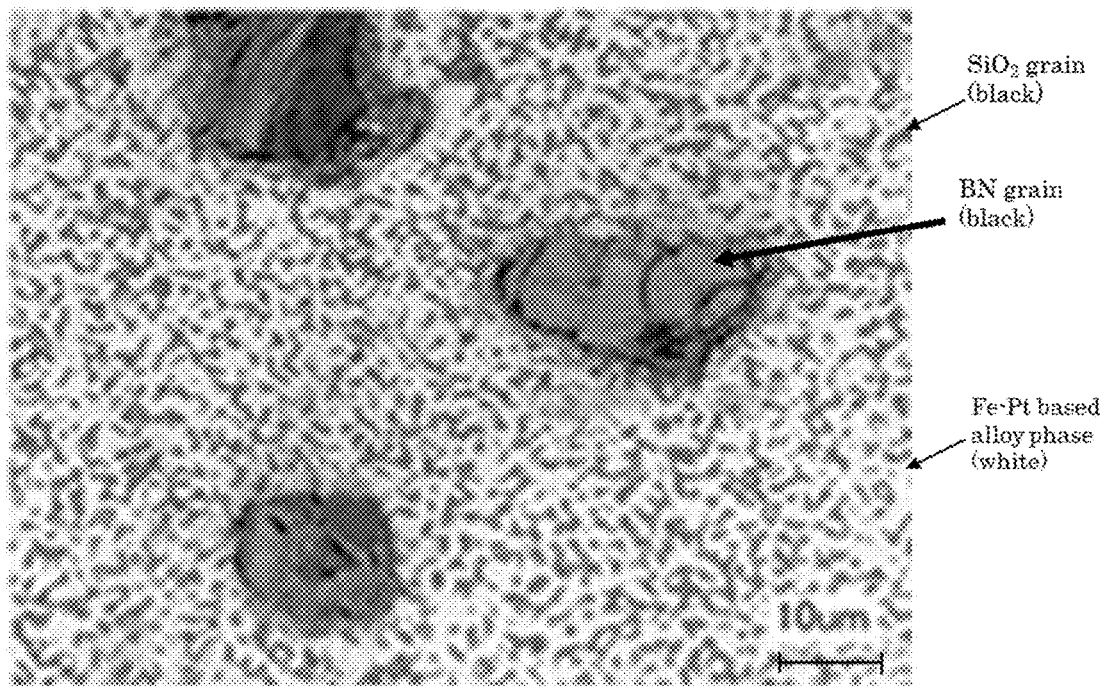
[FIG. 2]
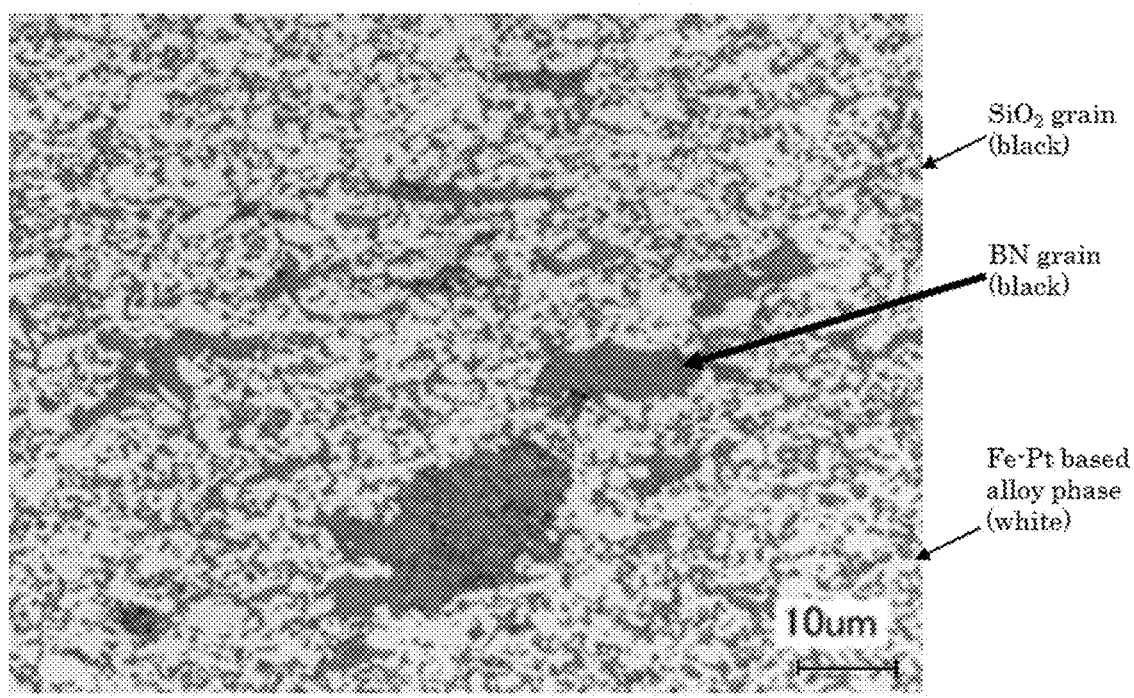

[FIG. 3]
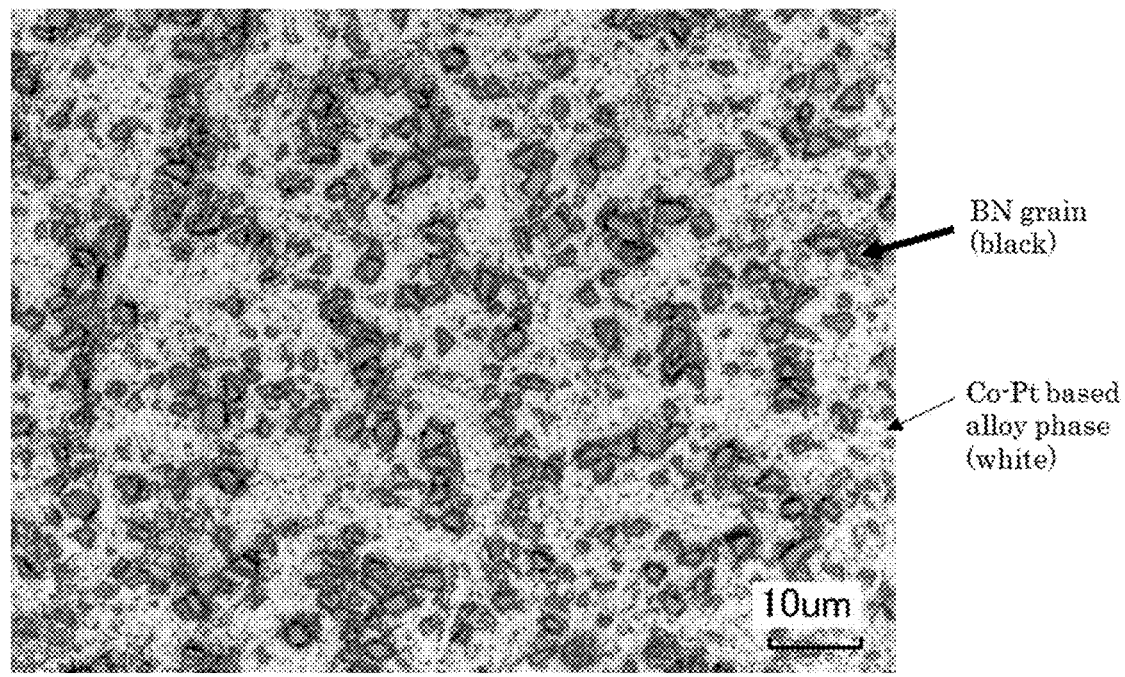

FERROMAGNETIC MATERIAL SPUTTERING TARGET

TECHNICAL FIELD

The present invention relates to a ferromagnetic material sputtering target that is suitable for forming a magnetic thin film in magnetic recording media.

BACKGROUND ART

In the field of magnetic recording represented by hard disk drives, materials based on a ferromagnetic metal Co, Fe or Ni are used as materials for magnetic thin films responsible for recording. For example, Co—Cr based or Co—Cr—Pt based ferromagnetic alloys containing Co as a main component have been used for recording layers of hard disks employing an in-plane magnetic recording system. Further, composite materials in which nonmagnetic grains such as oxides and carbon are dispersed in the Co—Cr—Pt based ferromagnetic alloy containing Co as a main component are widely used for recording layers of hard disks employing a perpendicular magnetic recording system which has been recently developed. The magnetic thin films are often produced by sputtering the sputtering targets containing the above materials using a DC magnetron sputtering apparatus, in terms of high productivity.

On the other hand, recording density of hard disks is rapidly increasing every year, and the hard disks having a capacity exceeding 1 Tbit/in$^2$ have been commercially available. When the recording density reaches 1 Tbit/in$^2$, then the size of the recorded bit will be lower than 10 nm. In this case, it is expected that there would be a problem of superparamagnetization due to thermal fluctuation, which would not be sufficiently addressed by the currently used materials of the magnetic recording media, for example those which have improved crystallomagnetic anisotropy obtained by adding Pt to the Co—Cr-based alloy, because the magnetic grains that stably act as ferromagnets in a size of 10 nm or less should have higher crystallomagnetic anisotropy.

For the reasons as described above, a Fe—Pt magnetic phase possessing a $L1_0$ structure is attracting attention as a material for ultrahigh density recording media. The Fe—Pt magnetic phase possessing the $L1_0$ structure is expected to be a material that is suitable for applications of magnetic recording media, because the Fe—Pt magnetic phase has higher crystalline magnetic anisotropy as well as improved corrosion resistance and oxidation resistance. When the Fe—Pt magnetic phase is used as the material for the ultrahigh density recording media, there is a need for development of technique for dispersing ordered Fe—Pt magnetic grains as dense as possible with uniform orientation, while magnetically isolating the ordered Fe—Pt magnetic grains.

Therefore, granular structure magnetic thin films in which the Fe—Pt magnetic phase possessing the $L1_0$ structure is isolated by nonmagnetic materials such as oxide, nitride, carbide and carbon have been proposed for magnetic recording media of next generation hard disks employing a heat-assisted magnetic recording system. The granular structure magnetic thin film includes a structure in which the magnetic grains are magnetically insulated from each other by interposition of nonmagnetic materials.

As the nonmagnetic materials, hexagonal BN (a compound of boron and nitrogen) is known, but its sinterability is poor. Thus, the hexagonal BN causes a problem of leading to defects such as cracking and chipping when processing a sintered compact into a target, and resulting in a lowered yield. There is also a problem that lower density of the target results in a large number of vacancies in the target, and these vacancies causes abnormal discharge, thereby generating particles (dusts adhering to the substrate) during sputtering, and resulting in a lowered product yield.

WO 2014/065201 (Patent Document 1) discloses that since the hexagonal BN, which is a nonmagnetic material, has a two-dimensional crystal structure, random orientations of the crystals of the hexagonal BN in the sintered compact causes unstable sputtering such as adversely affecting the electric condition and generating abnormal discharge. This document also discloses that the abnormal discharge during sputtering can be suppressed by improving orientation of the hexagonal BN in the Fe—Pt based sintered compact sputtering target containing BN, so that the amount of particles generated can be reduced.

Further, WO 2014/045744 (Patent Document 2) discloses that a high density sputtering target can be prepared by dispersing hexagonal BN grains which are nonmagnetic materials, together with SiO$_2$ grains in a Fe—Pt base metal. Further, it also discloses that the sputtering target thus prepared can extremely reduce the generation of particles and can improve the film forming yield.

CITATION LIST

Patent Literature

Patent Document 1: WO 2014/065201 A1
Patent Document 2: WO 2014/045744 A1

SUMMARY OF INVENTION

Technical Problem

Thus, some improvement proposals have been made for the problem of particles which are side effects due to the addition of BN to the ferromagnetic material sputtering target. However, it would be useful to provide an alternative technique for suppressing the particles in the ferromagnetic material sputtering targets containing BN, in order to extend the possibility of future technical development in the present technical field.

Therefore, one of objects of the present invention is to provide a BN-containing ferromagnetic material sputtering target which is capable of suppressing generation of particles during sputtering. Another object of the present invention is to provide a method for producing such a BN-containing ferromagnetic material sputtering target.

Solution to Problem

As a result of extensive investigations to solve the above problems, the present inventors have found that although the conventional hexagonal BN (hereinafter, also referred to as "h-BN") provides advantages that it is inexpensive and easily processed with a lathe or the like, it is effective to incorporate cubic BN (hereinafter, also referred to as "c-BN") into the ferromagnetic material sputtering target, in terms of suppressing the particles. While the present invention is not intended to be limited by any theory, it is considered that the c-BN grains dispersed in the ferromagnetic metal do not tend to generate cracks in the BN grains and have lower probability of shedding some of BN grains during sputtering, as compared with the h-BN grains, so that the amount of particles generated is reduced. The present invention has been completed based on such findings, and is illustrated as follows:

Aspect [1]

A sputtering target containing from 1 to 30 at. % of B and from 1 to 30 at. % of N and comprising a structure including at least one Fe—Pt based alloy phase and at least one nonmagnetic material phase, wherein an X-ray diffraction profile obtained by analyzing the structure with an X-ray diffraction method exhibits a diffraction peak derived from cubic boron nitride.

Aspect [2]

The sputtering target according to the aspect [1], wherein the X-ray diffraction profile obtained by analyzing the structure with the X-ray diffraction method is such that a ratio of diffraction peak integrated intensity derived from cubic boron nitride to diffraction peak integrated intensity derived from hexagonal boron nitride is 2.0 or more.

Aspect [3]

The sputtering target according to the aspect [1] or [2], wherein the sputtering target contains a total 15 at. % or less of one or more third elements selected from a group consisting of Ge, Au, Ag, Co, Cr, Cu, Mn, Mo, Nb, Ni, Pd, Re, Rh, Ru, Sn, Ta, W, V and Zn.

Aspect [4]

The sputtering target according to any one of the aspects [1] to [3], wherein the sputtering target comprises $SiO_2$.

Aspect [5]

A method for producing a sputtering target, comprising:
preparing a mixed powder containing at least two metal powders selected from Fe powder, Pt powder and Pt—Fe alloy powder; and c-BN powder, so as to contain from 1 to 30 at. % of B and from 1 to 30 at. % of N in the mixed powder; and
sintering the mixed powder at a temperature of 1300° C. or lower.

Aspect [6]

The method for producing the sputtering target according to the aspect [5], wherein the mixed powder contains a total 15 at. % or less of one or more third elements selected from a group consisting of Ge, Au, Ag, Co, Cr, Cu, Mn, Mo, Nb, Ni, Pd, Re, Rh, Ru, Sn, Ta, W, V and Zn.

Aspect [7]

The method for producing the sputtering target according to the aspect [5] or [6], wherein the mixed powder contains $SiO_2$.

Aspect [8]

A method for producing a sputtered film comprising using the sputtering target according to any one of the aspects [1] to [4].

Aspect [9]

A sputtering target containing from 1 to 40 at. % of B and from 1 to 30 at. % of N and comprising a structure including at least one Co—Pt based alloy phase and at least one nonmagnetic material phase, wherein an X-ray diffraction profile obtained by analyzing the structure with an X-ray diffraction method exhibits a diffraction peak derived from cubic boron nitride.

Aspect [10]

The sputtering target according to the aspect [9], wherein the X-ray diffraction profile obtained by analyzing the structure with the X-ray diffraction method is such that a ratio of diffraction peak integrated intensity derived from cubic boron nitride to diffraction peak integrated intensity derived from hexagonal boron nitride is 2.0 or more.

Aspect [11]

The sputtering target according to the aspect [9] or [10], wherein the sputtering target contains a total 15 at. % or less of one or more third elements selected from a group consisting of Ge, Au, Ag, Fe, Cr, Cu, Mn, Mo, Nb, Ni, Pd, Re, Rh, Ru, Sn, Ta, W, V and Zn.

Aspect [12]

The sputtering target according to any one of the aspects [9] to [11], wherein the sputtering target contains $SiO_2$.

Aspect [13]

A method for producing a sputtering target, comprising:
preparing a mixed powder containing at least two metal powders selected from Co powder, Pt powder and Pt—Co alloy powder; and c-BN powder, so as to contain from 1 to 40 at. % of B and from 1 to 30 at. % of N in the mixed powder; and
sintering the mixed powder at a temperature of 1300° C. or lower.

Aspect [14]

The method for producing the sputtering target according to the aspect [13], wherein the mixed powder contains a total 15 at. % or less of one or more third elements selected from a group consisting of Ge, Au, Ag, Fe, Cr, Cu, Mn, Mo, Nb, Ni, Pd, Re, Rh, Ru, Sn, Ta, W, V and Zn.

Aspect [15]

The method for producing the sputtering target according to the aspect [13] or [14], wherein the mixed powder contains $SiO_2$.

Aspect [16]

A method for producing a sputtered film comprising using the sputtering target according to any one of the aspects [9] to [12].

Aspect [17]

A sputtering target containing from 1 to 40 at. % of B and from 1 to 30 at. % of N and comprising a structure including at least one ferromagnetic metal-containing metal phase and at least one nonmagnetic material phase, wherein an X-ray diffraction profile obtained by analyzing the structure with an X-ray diffraction method exhibits a diffraction peak derived from cubic boron nitride.

Aspect [18]

The sputtering target according to the aspect [17], wherein the X-ray diffraction profile obtained by analyzing the structure with the X-ray diffraction method is such that a ratio of diffraction peak integrated intensity derived from cubic boron nitride to diffraction peak integrated intensity derived from hexagonal boron nitride is 2.0 or more.

Aspect [19]

The sputtering target according to the aspect [17] or [18], wherein the ferromagnetic metal-containing metal phase contains Pt.

Aspect [20]

The sputtering target according to the aspect [17] or [18], wherein the sputtering target contains a total 50 at. % or less of one or more third elements selected from a group consisting of Ge, Au, Ag, Cr, Cu, Mn, Mo, Nb, Pd, Re, Rh, Ru, Sn, Ta, W, V, and Zn.

Aspect [21]

The sputtering target according to the aspect [19], wherein the sputtering target contains a total 15 at. % or less of one or more third elements selected from a group consisting of Ge, Au, Ag, Cr, Cu, Mn, Mo, Nb, Pd, Re, Rh, Ru, Sn, Ta, W, V and Zn.

Aspect [22]

The sputtering target according to any one of the aspects [17] to [21], wherein the sputtering target contains $SiO_2$.

Aspect [23]

A method for producing a sputtering target, comprising:
preparing a mixed powder containing at least one ferromagnetic metal and c-BN, so as to contain from 1 to 40 at. % of B and from 1 to 30 at. % of N in the mixed powder; and
sintering the mixed powder at a temperature of 1300° C. or lower.

Aspect [24]

The method for producing the sputtering target according to the aspect [23], wherein the mixed powder contains two or more metal powders selected from ferromagnetic metal powder, Pt powder, and metal alloy powder containing ferromagnetic metal and Pt.

Aspect [25]

The sputtering target according to the aspect [23], wherein the sputtering target contains a total 50 at. % or less of one or more third elements selected from a group consisting of Ge, Au, Ag, Cr, Cu, Mn, Mo, Nb, Pd, Re, Rh, Ru, Sn, Ta, W, V and Zn.

Aspect [26]

The sputtering target according to the aspect [23] or [24], wherein the sputtering target contains a total 15 at. % or less of one or more third elements selected from a group consisting of Ge, Au, Ag, Cr, Cu, Mn, Mo, Nb, Pd, Re, Rh, Ru, Sn, Ta, W, V and Zn.

Aspect [27]

The sputtering target according to any one of the aspects [23] to [26], wherein the sputtering target contains $SiO_2$.

Aspect [28]

A method for producing a sputtered film comprising using the sputtering target according to any one of the aspects [17] to [22].

Advantageous Effects of Invention

The sputtering with the BN-containing ferromagnetic material sputtering target according to the present invention allows generation of particles to be suppressed during sputtering. The use of the sputtering target according to the present invention can provide advantageous effects that can improve the production yield of the granular-structured magnetic thin film comprising, for example, a Fe—Pt magnetic phase, a Co—Pt magnetic phase and/or a Ni—Pt magnetic phase.

BRIEF DESCRIPTION OF DRAWINGS

FIG. 1 is a laser micrograph of the cross-sectional structure of Example 1-1.

FIG. 2 is a laser micrograph of the cross-sectional structure of Comparative Example 1-1.

FIG. 3 is a laser micrograph of the cross-sectional structure of Example 2-1.

DESCRIPTION OF EMBODIMENTS (Ferromagnetic Metal-Containing Metal Phase)

In one embodiment, the sputtering target according to the present invention includes a structure in which nonmagnetic material phases are dispersed in at least one ferromagnetic metal-containing metal phase. There may exist a single metal phase having a single composition, or there may be two or more metal phases having different compositions. The metal phase may be an alloy phase. In another embodiment, the sputtering target according to the present invention thus includes a structure in which nonmagnetic material phases are dispersed in at least one alloy phase containing at least one ferromagnetic metal and Pt. The alloy containing at least one ferromagnetic metal and Pt means an alloy containing one or more ferromagnetic metals and Pt, and may optionally contain other alloy elements. There may exist an alloy phase having a single composition, or there may exist two or more alloy phases having different compositions. The ferromagnetic metal may include, in addition to Fe, Co and Ni, rare earth metals such as Gd, Tb, Dy, Ho, Er and Tm.

In one embodiment, the ferromagnetic metal-containing metal phase may include a composition containing a total 20 at. % or less of one or more third elements selected from the group consists of Ge, Au, Ag, B, Cr, Cu, Mn, Mo, Nb, Pd, Re, Rh, Ru, Sn, Ta, W, V and Zn, the balance being one or more ferromagnetic metals and inevitable impurities. In another embodiment, the alloy phase containing at least one ferromagnetic metal and Pt may include a composition containing from 5 to 60 at. % of Pt, the balance being one or more ferromagnetic metals and inevitable impurities. In yet another embodiment, the alloy phase containing at least one ferromagnetic metal and Pt may include a composition containing from 5 to 60 at. % of Pt and a total 20 at. % or less of one or more third elements selected from the group consisting of Ge, Au, Ag, B, Cr, Cu, Mn, Mo, Nb, Pd, Re, Rh, Ru, Sn, Ta, W, V and Zn, the balance being one or more ferromagnetic metals and inevitable impurities. In yet another embodiment, the alloy phase containing at least one ferromagnetic metal and Pt may include a composition containing from 5 to 60 at. % of Pt and a total 20 at. % or less of one or more third elements selected from the group consisting of Ge, Au, Ag, B, Cr, Cu, Mn, Mo, Nb, Pd, Re, Rh, Ru, Sn, Ta, W, V and Zn, the balance being one or more ferromagnetic metals selected from the group consisting of Fe, Co and Ni and inevitable impurities. In yet another embodiment, the alloy phase containing at least one ferromagnetic metal and Pt may include a composition containing from 5 to 60 at. % of Pt and a total 20 at. % or less of one or more third elements selected from the group consisting of Ge, Au, Ag, B, Co, Cr, Cu, Mn, Mo, Nb, Ni, Pd, Re, Rh, Ru, Sn, Ta, W, V and Zn, the balance being Fe and inevitable impurities. In yet another embodiment, the alloy phase containing at least one ferromagnetic metal and Pt may include a composition containing from 5 to 60 at. % of Pt and a total 20 at. % or less of one or more third elements selected from the group consisting of Ge, Au, Ag, B, Fe, Cr, Cu, Mn, Mo, Nb, Ni, Pd, Re, Rh, Ru, Sn, Ta, W, V and Zn, the balance being Co and inevitable impurities.

The alloy phase containing at least one ferromagnetic metal and Pt can form a magnetic phase in the structure of the sputtering target. The atomic concentration of Pt in the alloy phase containing at least one ferromagnetic metal and Pt may preferably be 35 at. % or more, and more preferably 40 at. % or more, and even more preferably 45 at. % or more, in terms of easily taking the form of an ordered alloy phase. For the same reason, the atomic concentration of Pt in the ferromagnetic metal-Pt based alloy phase may be 55 at. % or less, and more preferably 53 at. % or less, and more preferably 52 at. % or less.

However, if the ordered alloy phase is not required, a wider range of Pt content may be set. In this case, the ferromagnetic metal-containing metal phase may contain no Pt, and for example may contain from 0 to 60 at. % of Pt, and typically from 5 to 60 at. % of Pt.

The Fe—Pt based alloy phase can form the magnetic phase in the structure of the sputtering target. The atomic concentration of Pt in the Fe—Pt based alloy phase may be 35 at. % or more, and more preferably 40 at. % or more, and even more preferably 45 at. % or more, in terms of easily taking the form of an ordered alloy phase. For the same reason, the atomic concentration of Pt in the Fe—Pt based alloy phase may be 55 at. % or less, and more preferably 53 at. % or less, and even more preferably 52 at. % or less.

The Co—Pt based alloy phase can form the magnetic phase in the structure of the sputtering target. The atomic concentration of Pt in the alloy phase may be 5 at. % or more, and more preferably 7 at. % or more, and even more preferably 10 at. % or more, in terms of easily taking the form of a hexagonal close-packed structure with higher crystallomagnetic anisotropy. For the same reason, the atomic concentration of Pt in the Co—Pt based alloy phase may be 40 at. % or less, and more preferably 30 at. % or less, and even more preferably 25 at. % or less.

Further, Ge, Au, Ag, B, Cr, Cu, Mn, Mo, Nb, Pd, Re, Rh, Ru, Sn, Ta, W, V and Zn provides an effect of lowering the heat treatment temperature for ordering the alloy phase containing at least one ferromagnetic metal and Pt, and may also provide other effects, for example those of enhancing crystallomagnetic anisotropy energy and coercive force. Therefore, these elements may be positively added. These third elements may be contained in the ferromagnetic metal-containing metal phase, typically the alloy phase containing at least one ferromagnetic metal and Pt, in a total amount of 1 at. % or more, and more preferably in a total amount of 2.5 at. % or more, and even more preferably in a total amount of 5 at. % or more, in terms of significantly exerting the effects. These third elements may be preferably contained in the ferromagnetic metal-containing metal phase, typically the alloy phase containing at least one ferromagnetic metal and Pt, in a total amount of 20 at. % or less, and more preferably in a total amount of 15 at. % or less, and even more preferably in a total amount of 10 at. % or less, in terms of sufficiently providing the magnetic properties of the magnetic thin film when sputtered.

However, the sputtering target is mainly used as an underlayer for the magnetic thin film when the sputtering target does not contain Pt. Therefore, in view of the thin film properties it is often convenient for the sputtering target to have no magnetism, and it may be required for adding a large amount of the third element(s) to make the alloy nonmagnetic. As such, when the sputtering target does not contain Pt, the total amount of these third elements may be 60 at. % or less, and typically 50 at. % or less, and more typically 40 at. % or less.

It should be noted that although these third elements are generally present in the ferromagnetic metal-containing metal phase, typically in the alloy phase containing at least one ferromagnetic metal and Pt, they may be further present as a single phase separately from the alloy phase containing at least one ferromagnetic metal and Pt. Whether the third elements are present in the ferromagnetic metal-containing metal phase, typically in the alloy phase containing at least one ferromagnetic metal and Pt, or present as the single phase, can be determined by element mapping with an EPMA or the like.

The total content of these third elements (with the exception of B; the content of B will be defined below, because B is also added as a nitride as described below) in the sputtering target including both cases where these third elements are present in the ferromagnetic metal-containing metal phase, typically in the alloy phase containing at least one ferromagnetic metal and Pt and where they are present as the single phase may preferably be 0.5 at. % or more, and more preferably 2 at. % or more, and even more preferably 4 at. % or more, for the same reasons as described above. Further, when the sputtering target contains Pt, the total content of these third elements in the sputtering target may preferably be 15 at. % or less, and more preferably 12.5 at. % or less, and even more preferably 10 at. % or less, for the same reasons as described above. Furthermore, when the sputtering target does not contain Pt, the total content of these third elements in the sputtering target may preferably be 50 at. % or less, and typically 40 at. % or less, and even more typically 30 at. %, for the same reasons as described above.

The magnetic thin film made by the sputtering target according to the present invention includes a structure in which the nonmagnetic grains insulate magnetic interaction between the magnetic phases, and is thus expected to have good magnetic properties. The content rate (volume fraction) of the ferromagnetic metal-containing metal phase, typically the alloy phase containing at least one ferromagnetic metal and Pt, is not particularly limited as long as it is within a range that is capable of maintaining properties required for magnetic recording media, but it may preferably be 90 vol. % or less, and more preferably 80 vol. % or less, and even more preferably 75 vol. % or less, in terms of effectively exerting the effect of insulating the magnetic interaction. On the other hand, a lower content rate of the ferromagnetic metal-containing metal phase, typically the alloy phase containing at least one ferromagnetic metal and Pt and hence an increased rate of the nonmagnetic material will not only decrease electric conductivity of the target so that DC sputtering will be difficult, but also result in a generation source of particles. Therefore, in terms of ensuring productivity the content rate of the ferromagnetic metal-containing metal phase, typically the alloy phase containing at least one ferromagnetic metal and Pt, may preferably be 40 vol. % or more in the sputtering target, and more preferably 50 vol. % or more, and even more preferably 60 vol. % or more.

In the present invention, the content rate (volume fraction) of the ferromagnetic metal-containing metal phase, typically the alloy phase containing at least one ferromagnetic metal and Pt, in the sputtering target can be determined from an area ratio of the ferromagnetic metal-containing metal phase, typically the alloy phase containing at least one ferromagnetic metal and Pt, on the sputtering surface of the sputtering target. Hereinafter, measurement procedures for the content rate (volume ratio) of the ferromagnetic metal-containing metal phase will be described. The sputtering surface of the sputtering target is polished using coated abrasives with counts from P80 to P2000 in order, and finally buffed using aluminum oxide abrasive grains with a grain size of 0.3 μm to obtain a polished sputtering surface. The sputtering surface refers to all surfaces parallel to the surface to be sputtered. For example, for a general disk-shaped target, a plane horizontal in the in-plane direction is the sputtering surface. The polished sputtering surface is subjected to element mapping using an EPMA (electron beam microanalyzer) under the following conditions, and an average of the area ratios of the ferromagnetic metal-containing metal phase is examined. Observation conditions of the EPMA are as follows: an acceleration voltage of 15 kV, an irradiation current of 1 to $2 \times 10^{-7}$ A; a plurality of element mapping images with each element mapping image of 256×256 pixels (measurement time at 1 point of 1 msec) are acquired with an observation magnification of 2500 in different observation fields of view. By the element mapping, monochrome or color images are obtained depending on X-ray detection intensity for specific elements. The X-ray intensity map is then converted to a mass concentration map using analysis function equipped with the EPMA. The conversion is performed using a calibration curve (linear function) that correlates the X-ray detection intensity with the element concentration, which have been prepared by measuring a standard sample of each element. Using the converted mass concentration map, an average of the area ratios of the ferromagnetic metal-containing metal phase is then obtained. Assuming that the average area ratio equals the volume fraction, the content rate (volume fraction) of the ferromagnetic metal-containing metal phase in the sputtering target is obtained.

It should be noted that the above relational expression herein utilized is established between the average area ratio and the volume fraction for uniformly dispersed phases, (Mitsuo SHINKE ed.: Foundation and Application of Structure/Characteristic Analysis of 3D Material, Appendix A1, UCHIDA ROKAKUHO PUBLISHING CO., LTD., June, 2014).

(Nonmagnetic Material Phase)

In one embodiment, the sputtering target according to the present invention contains from 1 to 40 at. % of B and from 1 to 30 at. % of N, and is such that an X-ray diffraction profile obtained by analyzing the structure of the sputtering target with X-ray diffraction exhibits a diffraction peak derived from cubic boron nitride. Here, the atomic concentrations of B and N are those based on all components making up the sputtering target. B and N are present as boron nitride (BN) which is a nonmagnetic material, in a state where they are dispersed in the ferromagnetic metal-containing metal phase, typically the alloy phase containing at least one ferromagnetic metal and Pt. The phrase "X-ray diffraction profile exhibits a diffraction peak derived from cubic boron nitride" means that c-BN is present in the structure of the sputtering target. The presence of c-BN in the state where it is dispersed in the ferromagnetic metal-containing metal phase will lead to difficulty in generation of cracks within the BN grain and will lower the probability that some BN grains are shed during sputtering, so that an amount of particles to be generated will be reduced.

The lower limit of the concentration of B in the sputtering target of 1 at. % is the minimum amount necessary for BN as a compound containing B to play a role as a nonmagnetic material. The concentration of B may preferably be 5 at. % or more, and more preferably 10 at. % or more. Further, the reason why the upper limit of the concentration of B in the sputtering target is 40 at. % is that the magnetic properties of the sputtered film is avoided from being deteriorated due to a decrease in the proportion of the ferromagnetic metal-containing metal phase relative to the nonmagnetic material phases. The concentration of B may preferably be 30 at. % or less, and more preferably 25 at. % or less, and still more preferably 20 at. % or less.

The lower limit of the concentration of N in the sputtering target of 1 at. % is the minimum amount necessary for BN as a compound containing N to play a role as a nonmagnetic material. The concentration of N may preferably be 5 at. % or more, and more preferably 10 at. % or more. Further, the reason why the upper limit of the concentration of N in the sputtering target is 30 at. % is that the magnetic properties of the sputtered film is avoided from being deteriorated due to a decrease in the proportion of the ferromagnetic metal-containing metal phase relative to the nonmagnetic material phases. The concentration of B may preferably be 25 at. % or less, and more preferably 20 at. % or less.

It does not mean that no h-BN should be used as BN, but it is preferable to use c-BN as much as possible in terms of suppressing the amount of particles generated.

In the present invention, the method of analyzing the structure of the sputtering target by the X-ray diffraction method is as follows:

Analyzer: an X-ray diffractometer (in Examples, an X-ray diffractometer available from Rigaku Corporation (a fully automated horizontal multi-purpose X-ray diffraction system SmartLab) was used);

Tube: Cu (measured by CuKα);

Tube Voltage: 40 kV;

Tube Current: 30 mA

Optical System: a focusing diffraction optical system;

Scan Mode: 2θ/θ;

Scanning Range (2θ): from 10° to 90°;

Measurement Step (2θ): 0.02°;

Scanning Speed (2θ): 0.5° per minute;

Attachment: standard attachment;

Filter: CuKβ filter;

Counter Monochrome: none;

Counter: D/teX Ultra;

Divergence Slit: ⅔ deg;

Divergent Vertical Slit: 10.0 mm;

Scattering Slit: 10.0 mm;

Light Receiving Slit: 10.0 mm;

Attenuator: OPEN;

Angle (2θ) at which the diffraction peak of h-BN most strongly appears: 26.7° (002);

Angle (2θ) at which the diffraction peak of c-BN most strongly appears: 43.3° (111);

Measured Sample Size: approximately 20 mm×15 mm (measurement surface).

Analysis is carried out such that the sputtering surface of the sputtering target is the measurement surface of XRD. Further, the measurement surface is polished using coated abrasives with counts from P80 to P2000 in order, and finally buffed using aluminum oxide abrasive grains having a grain diameter of 0.3 μm. The resulting XRD profile was analyzed using an integrated powder X-ray analysis software PDXL (version 1.6.0.0) available from Rigaku Corporation in Examples. Here, the measured data were subjected to a peak search by automatic profile processing to calculate peak positions and integrated intensity.

For the peak search, the measured data are subjected to background noise removal, $K\alpha_2$ removal and smoothing in this order, and peaks are then detected by a secondary differentiation method. In the processing with the secondary differentiation method, a peak in which the intensity thereof is considered to be not sufficiently larger than an error is discarded and is not detected as a peak. Further, the peak shape is represented by a split pseudo Voigt function, and the peak position, half width, integrated intensity and the like can be calculated.

Methods and conditions for each processing in the peak search are described below:

Background Removal:

A fitting method using a polynomial (peak width threshold of 1.00, intensity threshold of 10.00);

$K\alpha_2$ Removal:

Rachinger method (intensity ratio of 0.5);

Smoothing:

A smoothing method with B spline (smoothing parameter of 10.00, score 3, x threshold value of 1.5).

Based on the result of the peak search, the presence or absence of a peak within a range of ±0.5° from each angle at which the diffraction peaks of h-BN and c-BN most strongly appear is examined. When a diffraction peak top is present in each range, it is determined that there is a diffraction peak derived from each BN crystal.

Here, when diffraction peaks of both h-BN and c-BN are present, the ratio (integrated intensity of c-BN)/(integrated intensity of h-BN) is determined from the respective integrated intensity. In a preferable embodiment of the present invention, the ratio may be 2.0 or more, and in a more preferable embodiment of the present invention, the ratio may be 2.5 or more, and in an even more preferable embodiment of the present invention, the ratio may be 3.0 or more. Although the upper limit may not be particularly set, the integrated intensity ratio is defined as ∞ (infinity) because when c-BN is used alone, then the integrated intensity of h-BN becomes 0.

In one embodiment, the sputtering target according to the present invention may contain, in addition to BN, one or more selected from the group consisting of carbon, carbide, oxide and nitride, as the nonmagnetic material. The nonmagnetic material can be dispersed as nonmagnetic material phases that are distinguishable from the ferromagnetic metal-containing metal phase in the sputtering target. Examples of the carbide include carbide of one or more elements selected from the group consisting of B, Ca, Nb, Si, Ta, Ti, W and Zr. Examples of the oxide include oxide of one or more elements selected from the group consisting of Si, Al, B, Ba, Be, Ca, Ce, Cr, Dy, Er, Eu, Ga, Gd, Ho, Li, Mg, Mn, Nb, Nd, Pr, Sc, Sm, Sr, Ta, Tb, Ti, V, Y, Zn and Zr. Among these oxides, $SiO_2$ may be preferably added because it provides an effect of greatly contributing to an increase in the density of the sputtering target. Examples of the nitride include nitride of one or more elements selected from the group consisting of Al, Ca, Nb, Si, Ta, Ti and Zr. These nonmagnetic materials may be optionally added depending on the magnetic properties required for the magnetic thin film.

(Production Method)

The sputtering target according to the present invention can be produced by a powder sintering method, for example, by the following method. First, as metal powder, ferromagnetic metal powder (e.g., Fe powder, Co powder, Ni powder, and ferromagnetic metal alloy powder), Pt powder, metal alloy powder containing the at least one ferromagnetic metal and Pt, and optionally third element powder and the like were prepared. The third element powder may be provided in the form of alloy powder with the ferromagnetic metal and/or Pt. These metal powders may be prepared by pulverizing an ingot obtained by melting and casting, or may be prepared as atomized powders.

Further, c-BN powder, carbon powder, carbide powder, nitride powder other than c-BN powder, oxide powder and the like are prepared as the nonmagnetic material powder. On this occasion, preferably 50% by mass or more of the BN powder to be blended may be c-BN powder, and more preferably 70% by mass or more of the BN powder may more be c-BN, and even more preferably 90% by mass of the BN powder may be c-BN powder, and most preferably 100% by mass of the BN powder may be c-BN powder, in terms of suppression of particles. Among the nonmagnetic materials, the carbon powder includes one having a crystal structure such as graphite (black lead) and a nanotube, and amorphous one as represented by carbon black, any of which can be used. When the $SiO_2$ powder is used, quartz or amorphous one may be preferable. When cristobalite is used as the $SiO_2$ powder, an α-β transition will occur at 250° C. to cause a change in volume, so that microcracks causing abnormal discharge are generated in the $SiO_2$ itself, which is not preferable.

The raw material powders (metal powder and nonmagnetic material powder) are weighed so as to have a desired composition, and they are pulverized and mixed together using a known approach such as a ball mill. On this occasion, it is desirable to suppress oxidation of the raw material powders as much as possible by enclosing an inert gas in the grinding container. Examples of the inert gas include Ar and $N_2$ gases. In this case, the raw material mixed powder may be pulverized until the median size (D50) of the raw material mixed powder is preferably 20 μm or less, and more preferably to 10 μm or less, and even more preferably 5 μm or less, in order to achieve a uniform structure. In order to prevent the oxidation of the powder, the median size (D50) of the mixed powder after pulverization may preferably be 0.3 μm or more, and more preferably 0.5 μm or more, and even more preferably 1.0 μm or more.

In the present invention, the median size of the raw material mixed powder means a particle size at an integrated value of 50% (D50) on volume value basis in the particle size distribution determined by a laser diffraction/scattering method. In Examples, the median size is measured in a dispersion of the powder in an ethanol solvent using a particle size distribution measuring device, model LA-920 available from HORIBA, Ltd. As a refractive index, the value of metal cobalt is used.

The raw material mixed powder thus obtained is formed and sintered by a hot pressing method in a vacuum atmosphere or an inert gas atmosphere. In addition to the hot pressing method, various pressure sintering methods such as a plasma discharge sintering method may be used. In particular, a hot isostatic pressing and sintering method (HIP) is effective for improving the density of the sintered compact, and the hot pressing method and the hot isostatic pressing and sintering method may be preferably carried out in this order, in terms of improving the density of the sintered compact.

The retention temperature during the sintering depends on the composition of the metal containing the at least one ferromagnetic metal, typically the alloy containing the at least one ferromagnetic metal and Pt. To prevent c-BN from decomposing or denaturing, the retention temperature may preferably be 1300° C. or lower, and more preferably 1150° C. or lower, and even more preferably 1050° C. or lower. Further, the retention temperature during the sintering may preferably be 650° C. or higher, and more preferably 700° C. or higher, and even more preferably 750° C. or higher, in order to avoid a decrease in the density of the sintered compact.

The pressing pressure during the sintering may preferably be 20 MPa or more, and more preferably 25 MPa or more, and still more preferably 30 MPa or more, in order to facilitate the sintering. The pressing pressure during the sintering may preferably be 70 MPa or less, and more preferably 50 MPa or less, and still more preferably 40 MPa or less, in view of the strength of the dies.

The sintering duration of time may preferably be 0.3 hours or more, and more preferably 0.5 hours or more, and still more preferably 1.0 hours or more, in order to improve the density of the sintered compact. The sintering duration of time may preferably be 3.0 hours or less, and more preferably 2.0 hours or less, and still more preferably 1.5 hours or less, in order to prevent coarsening of crystal grains.

The resulting sintered compact may be formed into a desired shape using a lathe or the like to obtain the sputtering target according to the present invention. The shape of the target includes, but not particularly limited to, a flat plate shape (including a disk shape and a rectangular plate shape) and a cylindrical shape, for example. The sputtering target according to the present invention is particularly useful as a sputtering target used for forming a granular structure magnetic thin film.

EXAMPLES

Hereinafter, the present invention will be more specifically described with reference to Examples, but the present invention is not limited to these Examples.

<<1. Case where the Alloy Phase Containing at Least One Ferromagnetic Metal and Pt is a Fe—Pt Alloy Phase>>

<Preparation of Sputtering Target>

As the raw material powder, Fe powder, Pt powder, $SiO_2$ powder, BN powder, graphite powder (C powder), Ge powder, Au powder, Ag powder, B powder and Co powder as shown in Table 1 were purchased and weighed so as to have each composition (mol. %) as shown in Table 1 according to each test number. The atomic concentrations (at. %) of B and N in the raw material powder in this case are also shown in Table 1. For the BN powder, h-BN powder or c-BN powder was used as shown in Table 1 according to the test number. Powder with SGP grade available from Denka Company Limited was used for the h-BN powder, and powder with ISBN-M grade (nominal grain size of 20 to 30 μm) available from Tomei Diamond Co., Ltd. was used for the c-BN powder.

The weighed powder was then charged into a medium agitating mill having a capacity of 5 L together with zirconia balls as grinding media, and mixed and pulverized by rotating the mill (a rotating speed of 300 rpm) for 2 hours. The volume-basis particle size distribution of the raw material mixed powder after pulverization was determined by a laser diffraction type particle size distribution measuring apparatus (model: LA-920, available from HORIBA, Ltd.), and the median size was calculated. The results are shown in Table 1.

The raw material mixed powder taken out of the medium agitating mill was then filled in a carbon mold and hot-pressed. The hot pressing were carried out under the following conditions: a vacuum atmosphere, a heating rate of 300° C./hour, a retention temperature of 1000° C., a retention time of 2 hours; the raw material mixed powder was pressed at 30 MPa from the start of the heating to the end of the retention. After the end of the retention, the pressed product was subjected to natural cooling within the chamber as it was.

The sintered compact taken out of the hot pressing mold was then subjected to hot isostatic pressing and sintering (HIP). The hot isostatic pressing and sintering was carried out under the following conditions: a heating temperature of 300° C./hour, a retention temperature of 950° C., a retention time of 2 hours; a gas pressure of Ar gas was gradually increased from the start of the heating and the pressurizing was carried at 150 MPa during the retention at 950° C. After the end of the temperature retention, the compact was subjected to natural cooling within the furnace as it was.

Next, using a lathe, each sintered compact was cut into a shape having a diameter of 180.0 mm and a thickness of 5.0 mm to provide a disk-shaped sputtering target. The target according to each test example obtained by the above producing procedures was cut using the lathe to prepare chips, which were subjected to composition analysis by an ICP-AES apparatus (available from Hitachi High-Tech Science Corporation (originally SII Corporation), apparatus name: SPS 3100 HV), confirming that the composition of each target was substantially the same as the weighed composition. Here, in order to improve the measurement accuracy, the metal composition analysis was carried out by drawing a calibration curve by the internal standard method.

TABLE 1

| Test Number | Weighed Composition (mol. %) | B Concentration (at. %) | N Concentration (at. %) | Raw Material BN Powder c-BN Powder | Raw Material BN Powder h-BN Powder | Raw Material Mixed Powder (Median Size, μm) |
|---|---|---|---|---|---|---|
| Comp. Example 1-1 | 39Fe—39Pt—12SiO$_2$—10BN | 7.46 | 7.46 | Unused | Used | 3.8 |
| Example 1-1 | 39Fe—39Pt—12SiO$_2$—10BN | 7.46 | 7.46 | Used | Unused | 4.6 |
| Comp. Example 1-2 | 38Fe—38Pt—24BN | 19.35 | 19.35 | Unused | Used | 9.5 |
| Example 1-2 | 38Fe—38Pt—24BN | 19.35 | 19.35 | Used | Unused | 8.9 |
| Example 1-3 | 38Fe—38Pt—24BN | 19.35 | 19.35 | 70 mass. % Used | 30 mass. % Used | 7.2 |
| Comp. Example 1-3 | 35Fe—35Pt—10BN—20C | 9.09 | 9.09 | Unused | Used | 7.3 |
| Example 1-4 | 35Fe—35Pt—10BN—20C | 9.09 | 9.09 | Used | Unused | 6.9 |
| Comp. Example 1-4 | 35Fe—35Pt—10Ge—20BN | 16.67 | 16.67 | Unused | Used | 7.3 |
| Example 1-5 | 35Fe—35Pt—10Ge—20BN | 16.67 | 16.67 | Used | Unused | 6.9 |
| Comp. Example 1-5 | 35Fe—35Pt—10Au—20BN | 16.67 | 16.67 | Unused | Used | 5.5 |
| Example 1-6 | 35Fe—35Pt—10Au—20BN | 16.67 | 16.67 | Used | Unused | 5.3 |
| Comp. Example 1-6 | 35Fe—35Pt—10Ag—20BN | 16.67 | 16.67 | Unused | Used | 1.9 |
| Example 1-7 | 35Fe—35Pt—10Ag—20BN | 16.67 | 16.67 | Used | Unused | 1.8 |
| Comp. Example 1-7 | 35Fe—35Pt—10B—20BN | 25.00 | 16.67 | Unused | Used | 4.3 |
| Example 1-8 | 35Fe—35Pt—10B—20BN | 25.00 | 16.67 | Used | Unused | 4.3 |
| Comp. Example 1-8 | 35Fe—35Pt—10Co—20BN | 16.67 | 16.67 | Unused | Used | 1.6 |
| Example 1-9 | 35Fe—35Pt—10Co—20BN | 16.67 | 16.67 | 20 mass. % Used | 80 mass. % Used | 1.7 |
| Example 1-10 | 35Fe—35Pt—10Co—20BN | 16.67 | 16.67 | 80 mass. % Used | 20 mass. % Used | 1.3 |

<Structure Analysis>

The sputtering surface of the sputtering target according to each test example obtained by the above producing procedures was polished. The structure of the polished sputtering surface was analyzed under the conditions as described above using the X-ray diffractometer (XRD), model SmartLab available from Rigaku Corporation. The results are shown in Table 2. The results obtained by observing the structure of the sputtering surface using a laser microscope are also shown in FIG. 1 (Example 1-1) and FIG. 2 (Comparative Example 1-1). The sputtering surfaces were subjected to element mapping using the EPMA (apparatus name: JXA-8500F, available from JEOL Ltd.) under the following conditions, demonstrating that in both of Example 1-1 and Comparative Example 1-1, the phases with white and black fine spot patterns were those in which $SiO_2$ was dispersed in the form of grains in the Fe—Pt based alloy phase and the larger black phases dispersed in the Fe—Pt based alloy phase were BN grains. For Examples 1-2 to 1-10 and Comparative Examples 1-2 to 1-8, element mapping was carried out in the same method, demonstrating that each of Comparative Example 1-2, Example 1-2 and Example 1-3 exhibited a structure in which the BN phases were dispersed in the Fe—Pt based alloy phase, and each of Comparative Example 1-3 and Example 1-4 exhibited a structure in which the BN phases and the C phases were dispersed in the Fe—Pt based alloy phase, and each of Comparative Example 1-4 and Example 1-5 exhibited a structure in which the BN phases were dispersed in the Fe—Pt—Ge based alloy phase, and each of Comparative Examples 1-5 and Example 1-6 exhibited a structure in which the BN phases and the Au phases were dispersed in the Fe—Pt based alloy phase, and each of Comparative Examples 1-6 and Example 1-7 exhibited a structure in which the BN phases and the Ag phases were dispersed in the Fe—Pt based alloy phase, and each of Comparative Examples 1-7 and Example 1-8 exhibited a structure in which the BN phases were dispersed in the Fe—Pt—B based alloy phase, and each of Comparative Example 1-8, Example 1-9 and Example 1-10 exhibited a structure in which the BN phases were dispersed in the Fe—Pt—Co based alloy phase. The observation conditions of the EPMA were as follows: an acceleration voltage of 15 kV, an irradiation current of from 1 to $2 \times 10^{-7}$ A, an observation magnification of 2500, and 256×256 pixels (measurement time at one point of 1 msec).

Further, measurement was made for the content rate (volume fraction) of the Fe—Pt based alloy phase in the sputtering target according to each test example obtained by the above producing procedures. The sputtering surface of the sputtering target was polished using coated abrasives with counts from P80 to P2000 in order, and finally buffed using aluminum oxide abrasive grains having a grain size of 0.3 μm to obtain a polished sputtering surface. The polished sputtering surface was subjected to element mapping using the EPMA (apparatus name: JXA-8500F, available from JEOL Ltd.) under the following conditions to examine an average area ratio of the Fe—Pt based alloy phase. The observation conditions for the EPMA were as follows: an acceleration voltage of 15 kV, and an irradiation current of 1 to $2 \times 10^{-7}$ A; ten element mapping images with 256×256 pixels (measurement time at one point of 1 msec) were acquired with an observation magnification of 2500 in different observation fields. In the element mapping, monochrome or color images corresponding to X-ray detection intensity of specific elements are obtained. Therefore, the X-ray intensity map was converted to a mass concentration map by using an analysis function of a surface analysis software (version 1.42) which was a basic software attached to the EPMA. The conversion was carried out by using a calibration curve (linear function) that correlated the X-ray detection intensity with the element concentration, which was prepared by measuring a standard sample of each element. Then, using the converted mass concentration map, the area ratio of the Fe—Pt based alloy phase was determined for each field of view, and an average of 10 fields of view was calculated. Subsequently, assuming that the average area ratio equals the volume fraction, the content rate (volume fraction) of the Fe—Pt based alloy phase in the sputtering target was obtained. The results are shown in Table 2.

<Film Formation Test>

The sputtering target according to each test example obtained by the above producing procedures was installed to a magnetron sputtering apparatus (C-3010 sputtering system available from CANON ANELVA CORPORATION), and sputtering was then carried out. The sputtering conditions were as follows: supplied power of 1 kW and Ar gas pressure of 1.7 Pa; a film was formed on a silicon substrate for 20 seconds. The number of particles (particle size of 0.25 to 3 μm) adhering to the substrate was measured using a particle counter (apparatus name: Surfscan 6420 available from KLA-Tencor Corporation). The results obtained by measuring the particles after 2 kWhr-sputtering from the start of sputtering are shown in Table 2. The sputtering surface of the sputtering target after film formation was observed by SEM, indicating that substantially no nodule was observed for Example 1-1, but the presence of nodules was observed for Comparative Example 1-1.

TABLE 2

| Test Number | XRD c-BN Peak | XRD h-BN Peak | Integrated Intensity Ratio (c-BN/h-BN) | Fe—Pt Based Alloy Phase Volume Fraction (vol. %) | Sputtering Property Number of Particles |
|---|---|---|---|---|---|
| Comp. Example 1-1 | Absent | Present | 0 | 59 | 438 |
| Example 1-1 | Present | Absent | ∞ | 59 | 42 |
| Comp. Example 1-2 | Absent | Present | 0 | 70 | 1087 |
| Example 1-2 | Present | Absent | ∞ | 70 | 96 |
| Example 1-3 | Present | Present | 2.3 | 70 | 382 |
| Comp. Example 1-3 | Absent | Present | 0 | 72 | 660 |
| Example 1-4 | Present | Absent | ∞ | 72 | 185 |
| Comp. Example 1-4 | Absent | Present | 0 | 76 | 674 |
| Example 1-5 | Present | Absent | ∞ | 76 | 210 |
| Comp. Example 1-5 | Absent | Present | 0 | 75 | 428 |
| Example 1-6 | Present | Absent | ∞ | 75 | 144 |
| Comp. Example 1-6 | Absent | Present | 0 | 64 | 356 |
| Example 1-7 | Present | Absent | ∞ | 64 | 64 |
| Comp. Example 1-7 | Absent | Present | 0 | 74 | 850 |
| Example 1-8 | Present | Absent | ∞ | 74 | 131 |
| Comp. Example 1-8 | Absent | Present | 0 | 74 | 592 |
| Example 1-9 | Present | Present | 0.13 | 74 | 430 |
| Example 1-10 | Present | Present | 2.9 | 74 | 107 |

<<2. Case where the Alloy Phase Containing at Least One Ferromagnetic Metal and Pt is a Co—Pt Based Alloy Phase>>

<Preparation of Sputtering Target>

As the raw material powder, Co powder, Cr powder, Pt powder, $SiO_2$ powder, $TiO_2$ powder, $B_2O_3$ powder, BN powder, graphite powder (C powder), Ru powder and B powder as shown in Table 3 were purchased and weighed so as to have each composition (mol. %) as shown in Table 3 according to each test number. The atomic concentrations (at. %) of B and N in the raw material powder in this case are also shown in Table 1. For the BN powder, h-BN powder or c-BN powder was used as shown in Table 3 according to the test number. Powder with SGP grade available from Denka Company Limited was used for the h-BN powder, and powder with ISBN-M grade (nominal grain size of 2 to 6 μm) available from Tomei Diamond Co., Ltd. was used for the c-BN powder.

The weighed powder was then charged into a medium agitating mill having a capacity of 5 L together with zirconia balls as grinding media, and mixed and pulverized by rotating the mill (a rotating speed of 300 rpm) for 2 hours. The volume-basis particle size distribution of the raw material mixed powder after pulverization was determined by a laser diffraction type particle size distribution measuring apparatus (model: LA-920, available from HORIBA, Ltd.), and the median size was calculated. The results are shown in Table 3.

The raw material mixed powder taken out of the medium agitating mill was then filled in a carbon mold and hot-pressed. The hot pressing were carried out under the following conditions: a vacuum atmosphere, a heating rate of 300° C./hour, a retention temperature of 1000° C., a retention time of 2 hours; the raw material mixed powder was pressed at 30 MPa from the start of the heating to the end of the retention. After the end of the retention, the pressed product was subjected to natural cooling within the chamber as it was.

The sintered compact taken out of the hot pressing mold was then subjected to hot isostatic pressing and sintering (HIP). The hot isostatic pressing and sintering was carried out under the following conditions: a heating temperature of 300° C./hour, a retention temperature of 950° C., a retention time of 2 hours; a gas pressure of Ar gas was gradually increased from the start of the heating and the pressurizing was carried at 150 MPa during the retention at 950° C. After the end of the temperature retention, the compact was subjected to natural cooling within the furnace as it was.

Next, using a lathe, each sintered compact was cut into a shape having a diameter of 180.0 mm and a thickness of 5.0 mm to provide a disk-shaped sputtering target. The target according to each test example obtained by the above producing procedures was cut using the lathe to prepare chips, which were subjected to composition analysis by an ICP-AES apparatus (available from Hitachi High-Tech Science Corporation (originally SII Corporation), apparatus name: SPS 3100 HV), confirming that the composition of each target was substantially the same as the weighed composition. Here, in order to improve the measurement accuracy, the metal composition analysis was carried out by drawing a calibration curve by the internal standard method.

TABLE 3

| Test Number | Weighed Composition (mol. %) | B Concentration (at. %) | N Concentration (at. %) | Raw Material BN Powder c-BN Powder | Raw Material BN Powder h-BN Powder | Raw Material Mixed Powder (Median Size, μm) |
|---|---|---|---|---|---|---|
| Comp. Example 2-1 | 52.5Co—17.5Pt—30BN | 23.08 | 23.08 | Unused | Used | 3.5 |
| Example 2-1 | 52.5Co—17.5Pt—30BN | 23.08 | 23.08 | Used | Unused | 3.6 |
| Comp. Example 2-2 | 56Co—4Cr—20Pt—20BN | 16.67 | 16.67 | Unused | Used | 4.3 |
| Example 2-2 | 56Co—4Cr—20Pt—20BN | 16.67 | 16.67 | Used | Unused | 4.3 |
| Comp. Example 2-3 | 59.5Co—4.25Cr—21.25Pt—5SiO$_2$—10BN | 8.33 | 8.33 | Unused | Used | 3.2 |
| Example 2-3 | 59.5Co—4.25Cr—21.25Pt—5SiO$_2$—10BN | 8.33 | 8.33 | Used | Unused | 3.1 |
| Comp. Example 2-4 | 61.6Co—15.4Pt—4TiO$_2$—4SiO$_2$—15BN | 11.45 | 11.45 | Unused | Used | 3.8 |
| Example 2-4 | 61.6Co—15.4Pt—4TiO$_2$—4SiO$_2$—15BN | 11.45 | 11.45 | Used | Unused | 3.2 |
| Comp. Example 2-5 | 64Co—8Cr—8Pt—3B$_2$O$_3$—3TiO$_2$—14BN | 15.15 | 10.61 | Unused | Used | 4.3 |
| Example 2-5 | 64Co—8Cr—8Pt—3B$_2$O$_3$—3TiO$_2$—14BN | 15.15 | 10.61 | Used | Unused | 4.5 |
| Comp. Example 2-6 | 56Co—1.6Cr—14.4Pt—8Ru—4SiO$_2$—16BN | 12.90 | 12.90 | Unused | Used | 5.3 |
| Example 2-6 | 56Co—1.6Cr—14.4Pt—8Ru—4SiO$_2$—16BN | 12.90 | 12.90 | Used | Unused | 4.3 |
| Comp. Example 2-7 | 56Co—1.4Cr—7Pt—5.6B—30BN | 27.38 | 23.08 | Unused | Used | 3.8 |
| Example 2-7 | 56Co—1.4Cr—7Pt—5.6B—30BN | 27.38 | 23.08 | 70 mass. % Used | 30 mass. % Used | 4.7 |
| Comp. Example 2-8 | 69.7Co—3.4Cr—3.4Pt—8.5B—5SiO$_2$—10BN | 15.42 | 8.33 | Unused | Used | 3.6 |
| Example 2-8 | 69.7Co—3.4Cr—3.4Pt—8.5B—5SiO$_2$—10BN | 15.42 | 8.33 | Used | Unused | 3.8 |
| Comp. Example 2-9 | 48Co—2.4Cr—9.6Pt—20BN—20C | 16.67 | 16.67 | Unused | Used | 7.8 |
| Example 2-9 | 48Co—2.4Cr—9.6Pt—20BN—20C | 16.67 | 16.67 | Used | Unused | 6.3 |
| Comp. Example 2-10 | 42Co—28Pt—30BN | 23.08 | 23.08 | Unused | Used | 3.9 |
| Example 2-10 | 42Co—28Pt—30BN | 23.08 | 23.08 | Used | Unused | 4.6 |
| Comp. Example 2-11 | 40Co—5Cr—10Pt—15B—25BN—5B$_2$O$_3$ | 34.48 | 17.24 | Unused | Used | 7.8 |
| Example 2-11 | 40Co—5Cr—10Pt—15B—25BN—5B$_2$O$_3$ | 34.48 | 17.24 | Used | Unused | 6.7 |

<Structure Analysis>

The sputtering surface of the sputtering target according to each test example obtained by the above producing procedures was polished. The structure of the polished sputtering surface was analyzed under the conditions as described above using an X-ray diffractometer (XRD), model SmartLab available from Rigaku Corporation. The results are shown in Table 4. The results obtained by observing the structure of the sputtering surface using a laser microscope are also shown in FIG. 3 (Example 2-1). The sputtering surfaces of Comparative Example 2-1 and Example 2-1 were subjected to element mapping using the EPMA (apparatus name: JXA-8500F, available from JEOL Ltd.) under the following conditions, demonstrating that in both of Comparative Example 2-1 and Example 2-1, large and black phases dispersed in the Co—Pt based alloy phase were BN grains. For Examples 2-2 to 2-11 and Comparative Examples 2-2 to 2-11, element mapping was carried out in the same method, demonstrating that each of Comparative Example 2-2 and Example 2-2 exhibited a structure in which the BN phases were dispersed in the Co—Cr—Pt based alloy phase, and each of Comparative Example 2-3 and Example 2-3 exhibited a structure in which the SiO$_2$ phases and the BN phases were dispersed in the Co—Cr—Pt based alloy phase, and each of Comparative Example 2-4 and Example 2-4 exhibited a structure in which the SiO$_2$ phases, the TiO$_2$ phases and the BN phases were dispersed in the Co—Pt based alloy phase, and each of Comparative Examples 2-5 and Example 2-5 exhibited a structure in which the $B_2O_3$ phases, the $TiO_2$ phases and the BN phases were dispersed in the Co—Cr—Pt based alloy phase, and each of Comparative Examples 2-6 and Example 2-6 exhibited a structure in which the $SiO_2$ phases and the BN phases were dispersed in the Co—Cr—Pt—Ru based alloy phase, and each of Comparative Examples 2-7 and Example 2-7 exhibited a structure in which the BN phases were dispersed in the Co—Cr—Pt—B based alloy phase, and each of Comparative Example 2-8 and Example 2-8 exhibited a structure in which the $SiO_2$ phases and the BN phases were dispersed in the Co—Cr—Pt—B based alloy phase, and each of Comparative Example 2-9 and Example 2-9 exhibited a structure in which the BN phases and the C phases were dispersed in the Co—Cr—Pt based alloy phase, and each of Comparative Example 2-10 and Example 2-10 exhibited a structure in which the BN phases were dispersed in the Co—Pt based alloy phase, and each of Comparative Example 2-11 and Example 2-11 exhibited a structure in which the $B_2O_3$ phases and the BN phases were dispersed in the Co—Cr—Pt—B based alloy. The observation conditions of the EPMA were as follows: an acceleration voltage of 15 kV, an irradiation current of from 1 to $2 \times 10^{-7}$ A, an observation magnification of 2500, and 256×256 pixels (measurement time at one point of 1 msec).

Further, measurement was made for the content rate (volume fraction) of the Co—Pt based alloy phase in the sputtering target according to each test example obtained by the above producing procedures. The sputtering surface of the sputtering target was polished using coated abrasives with counts from P80 to P2000 in order, and finally buffed using aluminum oxide abrasive grains having a grain size of 0.3 μm to obtain a polished sputtering surface. The polished sputtering surface was subjected to element mapping using the EPMA (apparatus name: JXA-8500F, available from JEOL Ltd.) under the following conditions to examine an average area ratio of the Co—Pt based alloy phase. The observation conditions for the EPMA were as follows: an acceleration voltage of 15 kV, and an irradiation current of 1 to $2 \times 10^{-7}$ A; ten element mapping images with 256×256 pixels (measurement time at one point of 1 msec) were acquired with an observation magnification of 2500 in different observation fields. In the element mapping, monochrome or color images corresponding to X-ray detection intensity of specific elements are obtained. Therefore, the X-ray intensity map was converted to a mass concentration map by using an analysis function of a surface analysis software (version 1.42) which was a basic software attached to the EPMA. The conversion was carried out by using a calibration curve (linear function) that correlated the X-ray detection intensity with the element concentration, which was prepared by measuring a standard sample of each element. Then, using the converted mass concentration map, the area ratio of the Co—Pt based alloy phase was determined for each field of view, and an average of 10 fields of view was calculated. Subsequently, assuming that the average area ratio equals the volume fraction, the content rate (volume fraction) of the Co—Pt based alloy phase in the sputtering target was obtained. The results are shown in Table 4.

<Film Formation Test>

The sputtering target according to each test example obtained by the above producing procedures was installed to a magnetron sputtering apparatus (C-3010 sputtering system available from CANON ANELVA CORPORATION), and sputtering was then carried out. The sputtering conditions were as follows: supplied power of 1 kW and Ar gas pressure of 1.7 Pa; a film was formed on a silicon substrate for 20 seconds. The number of particles (particle size of 0.25 to 3 μm) adhering to the substrate was measured using a particle counter (apparatus name: Surfscan 6420 available from KLA-Tencor Corporation). The results obtained by measuring the particles after 2 kWhr-sputtering from the start of sputtering are shown in Table 4. The sputtering surface of the sputtering target after film formation was observed by SEM, indicating that substantially no nodule was observed for Example 2-1, but the presence of nodules was observed for Comparative Example 2-1.

TABLE 4

| Test Number | XRD c-BN Peak | XRD h-BN Peak | integrated intensity ratio (c-BN/h-BN) | Co—Pt Based Alloy Phase Volume Fraction (vol. %) | Sputtering Property Number of particles |
|---|---|---|---|---|---|
| Comp. Example 2-1 | Absent | Present | 0 | 60 | 1205 |
| Example 2-1 | Present | Absent | ∞ | 70 | 72 |
| Comp. Example 2-2 | Absent | Present | 0 | 72 | 609 |
| Example 2-2 | Present | Absent | ∞ | 80 | 48 |
| Comp. Example 2-3 | Absent | Present | 0 | 71 | 415 |
| Example 2-3 | Present | Absent | ∞ | 75 | 44 |
| Comp. Example 2-4 | Absent | Present | 0 | 61 | 488 |
| Example 2-4 | Present | Absent | ∞ | 65 | 95 |
| Comp. Example 2-5 | Absent | Present | 0 | 63 | 910 |
| Example 2-5 | Present | Absent | ∞ | 67 | 156 |
| Comp. Example 2-6 | Absent | Present | 0 | 68 | 360 |
| Example 2-6 | Present | Absent | ∞ | 72 | 79 |
| Comp. Example 2-7 | Absent | Present | 0 | 59 | 1968 |
| Example 2-7 | Present | Present | 2.1 | 64 | 257 |
| Comp. Example 2-8 | Absent | Present | 0 | 69 | 547 |
| Example 2-8 | Present | Absent | ∞ | 73 | 120 |
| Comp. Example 2-9 | Absent | Present | 0 | 57 | 2097 |
| Example 2-9 | Present | Absent | ∞ | 63 | 275 |
| Comp. Example 2-10 | Absent | Present | 0 | 59 | 1250 |
| Example 2-10 | Present | Absent | ∞ | 69 | 105 |
| Comp. Example 2-11 | Absent | Present | 0 | 50 | 1598 |
| Example 2-11 | Present | Absent | ∞ | 56 | 227 |

<<3. Case where Pt is not Contained in the Phase Containing the at Least One Ferromagnetic Metal>>

<Preparation of Sputtering Target>

As the raw material powder, Co powder, Fe powder, Ni powder, B powder, Cr powder, $TiO_2$ powder, BN powder and Ru powder as shown in Table 5 were purchased and weighed so as to have each composition (mol. %) as shown in Table 5 according to each test number. The atomic concentrations (at. %) of B and N in the raw material powder in this case are also shown in Table 5. For the BN powder, h-BN powder or c-BN powder was used as shown in Table 5 according to the test number. Powder with SGP grade available from Denka Company Limited was used for the h-BN powder, and powder with ISBN-M grade (nominal grain size of 2 to 6 μm) available from Tomei Diamond Co., Ltd. was used for the c-BN powder.

The weighed powder was then charged into a medium agitating mill having a capacity of 5 L together with zirconia balls as grinding media, and mixed and pulverized by rotating the mill (a rotating speed of 300 rpm) for 2 hours. The volume-basis particle size distribution of the raw material mixed powder after pulverization was determined by a laser diffraction type particle size distribution measuring apparatus (model: LA-920, available from HORIBA, Ltd.), and the median size was calculated. The results are shown in Table 5.

The raw material mixed powder taken out of the medium agitating mill was then filled in a carbon mold and hot-pressed. The hot pressing were carried out under the following conditions: a vacuum atmosphere; a heating rate of 300° C./hour, a retention temperature of 1000° C., a retention time of 2 hours; the raw material mixed powder was pressed at 30 MPa from the start of the heating to the end of the retention. After the end of the retention, the pressed product was subjected to natural cooling within the chamber as it was.

The sintered compact taken out of the hot pressing mold was then subjected to hot isostatic pressing and sintering (HIP). The hot isostatic pressing and sintering was carried out under the following conditions: a heating temperature of 300° C./hour, a retention temperature of 950° C., a retention time of 2 hours; a gas pressure of Ar gas was gradually increased from the start of the heating and the pressurizing was carried at 150 MPa during the retention at 950° C. After the end of the temperature retention, the compact was subjected to natural cooling within the furnace as it was.

Next, using a lathe, each sintered compact was cut into a shape having a diameter of 180.0 mm and a thickness of 5.0 mm to provide a disk-shaped sputtering target. The target according to each test example obtained by the above producing procedures was cut using the lathe to prepare chips, which were subjected to composition analysis by an ICP-AES apparatus (available from Hitachi High-Tech Science Corporation (originally SII Corporation), apparatus name: SPS 3100 HV), confirming that the composition of each target was substantially the same as the weighed composition. Here, in order to improve the measurement accuracy, the metal composition analysis was carried out by drawing a calibration curve by the internal standard method.

to element mapping using the EPMA (apparatus name: JXA-8500F, available from JEOL Ltd.) under the following conditions, demonstrating that in both of Comparative Example 3-1 and Example 3-1, the large and black phases dispersed in the Co—Cr—Ru based alloy phase were BN grains. For Examples 3-2 to 3-5 and Comparative Examples 3-2 to 3-5, element mapping was carried out in the same method, demonstrating that each of Comparative Example 3-2 and Example 3-2 exhibited a structure in which the $TiO_2$ phases and the BN phases were dispersed in the Co—Ru based alloy phase, and each of Comparative Example 3-3 and Example 3-3 exhibited a structure in which the BN phases were dispersed in the Co—Fe based alloy phase, and each of Comparative Example 3-4 and Example 3-4 exhibited a structure in which the BN phases were dispersed in the Ni—Cr based alloy phase, and each of Comparative Examples 3-5 and Example 3-5 exhibited a structure in which the BN phases were dispersed in the Co—Cr based alloy phase. The observation conditions of the EPMA were as follows: an acceleration voltage of 15 kV, an irradiation current of from 1 to $2 \times 10^{-7}$ A, an observation magnification of 2500, and 256×256 pixels (measurement time at one point of 1 msec).

Further, measurement was made for the content rate (volume fraction) of the alloy phase containing at least one ferromagnetic metal in the sputtering target according to each test example obtained by the above producing procedures. The sputtering surface of the sputtering target was polished using coated abrasives with counts from P80 to P2000 in order, and finally buffed using aluminum oxide abrasive grains having a grain size of 0.3 μm to obtain a polished sputtering surface. The polished sputtering surface was subjected to element mapping using the EPMA (apparatus name: JXA-8500F, available from JEOL Ltd.) under the following conditions to examine an average area ratio of the alloy phase containing at least one ferromagnetic metal. The observation conditions for the EPMA were as follows: an acceleration voltage of 15 kV, and an irradiation current of 1 to $2 \times 10^{-7}$ A; ten element mapping images with 256×256 pixels (measurement time at one point of 1 msec) were

TABLE 5

| Test Number | Weighed Composition (mol. %) | B Concentration (at. %) | N Concentration (at. %) | Raw Material BN Powder c-BN Powder | Raw Material BN Powder h-BN Powder | Raw Material Mixed Powder (Median Size, μm) |
|---|---|---|---|---|---|---|
| Comp. Example 3-1 | 56Co—4Cr—20Ru—20BN | 16.67 | 16.67 | Unused | Used | 4.5 |
| Example 3-1 | 56Co—4Cr—20Ru—20BN | 16.67 | 16.67 | Used | Unused | 4.7 |
| Comp. Example 3-2 | 40Co—30Ru—20BN—10TiO$_2$ | 14.29 | 14.29 | Unused | Used | 5.2 |
| Example 3-2 | 40Co—30Ru—20BN—10TiO$_2$ | 14.29 | 14.29 | Used | Unused | 6 |
| Comp. Example 3-3 | 40Co—30Fe—30BN | 28.57 | 28.57 | Unused | Used | 4.7 |
| Example 3-3 | 40Co—30Fe—30BN | 28.57 | 28.57 | Used | Unused | 4.7 |
| Comp. Example 3-4 | 40Ni—30Cr—30BN | 23.08 | 23.08 | Unused | Used | 2.8 |
| Example 3-4 | 40Ni—30Cr—30BN | 23.08 | 23.08 | Used | Unused | 2.4 |
| Comp. Example 3-5 | 55Co—5Cr—15B—25BN | 32.00 | 20.00 | Unused | Used | 6.5 |
| Example 3-5 | 55Co—5Cr—15B—25BN | 32.00 | 20.00 | Used | Unused | 6.4 |

<Structure Analysis>

The sputtering surface of the sputtering target according to each test example obtained by the above producing procedures was polished. The structure of the polished sputtering surface was analyzed under the conditions as described above using the X-ray diffractometer (XRD), model SmartLab available from Rigaku Corporation. The results are shown in Table 6. The sputtering surfaces of Comparative Example 3-1 and Example 3-1 were subjected acquired with an observation magnification of 2500 in different observation fields. In the element mapping, monochrome or color images corresponding to X-ray detection intensity of specific elements are obtained. Therefore, the X-ray intensity map was converted to a mass concentration map by using an analysis function of a surface analysis software (version 1.42) which was a basic software attached to the EPMA. The conversion was carried out by using a calibration curve (linear function) that correlated the X-ray detection intensity with the element concentration, which was prepared by measuring a standard sample of each element. Then, using the converted mass concentration map, the area ratio of the alloy phase containing at least one ferromagnetic metal was determined for each field of view, and an average of 10 fields of view was calculated. Subsequently, assuming that the average area ratio equals the volume fraction, the content rate (volume fraction) of the alloy phase containing at least one ferromagnetic metal in the sputtering target was obtained. The results are shown in Table 6.

<Film Formation Test>

The sputtering target according to each test example obtained by the above producing procedures was installed to a magnetron sputtering apparatus (C-3010 sputtering system available from CANON ANELVA CORPORATION), and sputtering was then carried out. The sputtering conditions were as follows: supplied power of 1 kW and Ar gas pressure of 1.7 Pa; a film was formed on a silicon substrate for 20 seconds. The number of particles (particle size of 0.25 to 3 μm) adhering to the substrate was measured using a particle counter (apparatus name: Surfscan 6420 available from KLA-Tencor Corporation). The results obtained by measuring the particles after 2 kWhr-sputtering from the start of sputtering are shown in Table 6. The sputtering surface of the sputtering target after film formation was observed by SEM, indicating that substantially no nodule was observed for Example 3-1, but the presence of nodules was observed for Comparative Example 3-1.

TABLE 6

| Test Number | XRD c-BN Peak | XRD h-BN Peak | integrated intensity ratio (c-BN/h-BN) | Alloy Phase Containing Ferromagnetic Metal Volume Fraction (vol. %) | Sputtering Property Number of particles |
|---|---|---|---|---|---|
| Comp. Example 3-1 | Absent | Present | 0 | 72 | 836 |
| Example 3-1 | Present | Absent | ∞ | 80 | 73 |
| Comp. Example 3-2 | Absent | Present | 0 | 56 | 589 |
| Example 3-2 | Present | Absent | ∞ | 61 | 67 |
| Comp. Example 3-3 | Absent | Present | 0 | 59 | 901 |
| Example 3-3 | Present | Absent | ∞ | 69 | 88 |
| Comp. Example 3-4 | Absent | Present | 0 | 63 | 955 |
| Example 3-4 | Present | Absent | ∞ | 72 | 83 |
| Comp. Example 3-5 | Absent | Present | 0 | 63 | 795 |
| Example 3-5 | Present | Absent | ∞ | 72 | 115 |

The invention claimed is:

1. A sputtering target containing from 1 to 30 at. % of B and from 1 to 30 at. % of N and comprising a structure including at least one Fe—Pt based alloy phase and at least one nonmagnetic material phase, wherein an X-ray diffraction profile obtained by analyzing the structure with an X-ray diffraction method exhibits a diffraction peak derived from cubic boron nitride.

2. The sputtering target according to claim 1, wherein the X-ray diffraction profile obtained by analyzing the structure with the X-ray diffraction method is such that a ratio of diffraction peak integrated intensity derived from cubic boron nitride to diffraction peak integrated intensity derived from hexagonal boron nitride is 2.0 or more.

3. The sputtering target according to claim 1, wherein the sputtering target contains a total 15 at. % or less of one or more third elements selected from a group consisting of Ge, Au, Ag, Co, Cr, Cu, Mn, Mo, Nb, Ni, Pd, Re, Rh, Ru, Sn, Ta, W, V and Zn.

4. The sputtering target according to claim 1, wherein the sputtering target contains $SiO_2$.

5. A method for producing a sputtering target, comprising:
preparing a mixed powder containing at least two metal powders selected from Fe powder, Pt powder and Pt—Fe alloy powder; and c-BN powder, so as to contain from 1 to 30 at. % of B and from 1 to 30 at. % of N in the mixed powder; and
sintering the mixed powder at a temperature of 1300° C. or lower.

6. The method for producing the sputtering target according to claim 5, wherein the mixed powder contains a total 15 at. % or less of one or more third elements selected from a group consisting of Ge, Au, Ag, Co, Cr, Cu, Mn, Mo, Nb, Ni, Pd, Re, Rh, Ru, Sn, Ta, W, V and Zn.

7. The method for producing the sputtering target according to claim 5, wherein the mixed powder contains $SiO_2$.

8. A method for producing a sputtered film comprising sputtering the sputtering target according to claim 1.

9. A sputtering target containing from 1 to 40 at. % of B and from 1 to 30 at. % of N and comprising a structure including at least one Co—Pt based alloy phase and at least one nonmagnetic material phase, wherein an X-ray diffraction profile obtained by analyzing the structure with an X-ray diffraction method exhibits a diffraction peak derived from cubic boron nitride.

10. The sputtering target according to claim 9, wherein the X-ray diffraction profile obtained by analyzing the structure with the X-ray diffraction method is such that a ratio of diffraction peak integrated intensity derived from cubic boron nitride to diffraction peak integrated intensity derived from hexagonal boron nitride is 2.0 or more.

11. The sputtering target according to claim 9, wherein the sputtering target contains a total 15 at. % or less of one or more third elements selected from a group consisting of Ge, Au, Ag, Fe, Cr, Cu, Mn, Mo, Nb, Ni, Pd, Re, Rh, Ru, Sn, Ta, W, V and Zn.

12. The sputtering target according to claim 9, wherein the sputtering target contains $SiO_2$.

13. A method for producing a sputtering target, comprising:
preparing a mixed powder containing at least two metal powders selected from Co powder, Pt powder and Pt—Co alloy powder; and c-BN powder, so as to contain from 1 to 40 at. % of B and from 1 to 30 at. % of N in the mixed powder; and
sintering the mixed powder at a temperature of 1300° C. or lower.

14. The method for producing the sputtering target according to claim 13, wherein the mixed powder contains a total 15 at. % or less of one or more third elements selected from a group consisting of Ge, Au, Ag, Fe, Cr, Cu, Mn, Mo, Nb, Ni, Pd, Re, Rh, Ru, Sn, Ta, W, V and Zn.

15. The method for producing the sputtering target according to claim 13, wherein the mixed powder contains $SiO_2$.

16. A method for producing a sputtered film comprising sputtering the sputtering target according to claim 9.

17. A sputtering target containing from 1 to 40 at. % of B and from 1 to 30 at. % of N and comprising a structure including at least one ferromagnetic metal-containing metal phase and at least one nonmagnetic material phase, wherein an X-ray diffraction profile obtained by analyzing the structure with an X-ray diffraction method exhibits a diffraction peak derived from cubic boron nitride.

18. The sputtering target according to claim 17, wherein the X-ray diffraction profile obtained by analyzing the structure with the X-ray diffraction method is such that a ratio of diffraction peak integrated intensity derived from cubic boron nitride to diffraction peak integrated intensity derived from hexagonal boron nitride is 2.0 or more.

19. The sputtering target according to claim 17, wherein the ferromagnetic metal-containing metal phase contains Pt.

20. The sputtering target according to claim 17, wherein the sputtering target contains a total 50 at. % or less of one or more third elements selected from a group consisting of Ge, Au, Ag, Cr, Cu, Mn, Mo, Nb, Pd, Re, Rh, Ru, Sn, Ta, W, V, and Zn.

21. The sputtering target according to claim 19, wherein the sputtering target contains a total 15 at. % or less of one or more third elements selected from a group consisting of Ge, Au, Ag, Cr, Cu, Mn, Mo, Nb, Pd, Re, Rh, Ru, Sn, Ta, W, V and Zn.

22. The sputtering target according to claim 17, wherein the sputtering target contains $SiO_2$.

23. A method for producing a sputtering target, comprising:
preparing a mixed powder containing at least one ferromagnetic metal and c-BN, so as to contain from 1 to 40 at. % of B and from 1 to 30 at. % of N in the mixed powder; and
sintering the mixed powder at a temperature of 1300° C. or lower.

24. The method for producing the sputtering target according to claim 23, wherein the mixed powder contains two or more metal powders selected from ferromagnetic metal powder, Pt powder, and metal alloy powder containing ferromagnetic metal and Pt.

25. The sputtering target according to claim 23, wherein the sputtering target contains a total 50 at. % or less of one or more third elements selected from a group consisting of Ge, Au, Ag, Cr, Cu, Mn, Mo, Nb, Pd, Re, Rh, Ru, Sn, Ta, W, V and Zn.

26. The sputtering target according to claim 23, wherein the sputtering target contains a total 15 at. % or less of one or more third elements selected from a group consisting of Ge, Au, Ag, Cr, Cu, Mn, Mo, Nb, Pd, Re, Rh, Ru, Sn, Ta, W, V and Zn.

27. The sputtering target according to claim 23, wherein the sputtering target contains $SiO_2$.

28. A method for producing a sputtered film comprising sputtering the sputtering target according to claim 17.

* * * * *